(12) United States Patent
Yamanaka

(10) Patent No.: US 8,749,677 B2
(45) Date of Patent: Jun. 10, 2014

(54) IMAGING ELEMENT AND IMAGING DEVICE

(75) Inventor: Hideki Yamanaka, Yokohama (JP)

(73) Assignee: Nikon Corporation, Tokyo (JP)

(*) Notice: Subject to any disclaimer, the term of this patent is extended or adjusted under 35 U.S.C. 154(b) by 648 days.

(21) Appl. No.: 13/060,132

(22) PCT Filed: Aug. 26, 2009

(86) PCT No.: PCT/JP2009/004136
§ 371 (c)(1),
(2), (4) Date: Feb. 22, 2011

(87) PCT Pub. No.: WO2010/023903
PCT Pub. Date: Mar. 4, 2010

(65) Prior Publication Data
US 2011/0149135 A1    Jun. 23, 2011

(30) Foreign Application Priority Data

Sep. 1, 2008    (JP) ................................ 2008-223371

(51) Int. Cl.
*H04N 3/14* (2006.01)
*H04N 5/335* (2011.01)

(52) U.S. Cl.
USPC ........................................ 348/296; 348/308

(58) Field of Classification Search
USPC .......... 348/296, 302, 308; 257/291, 292, 293, 257/294; 250/208.1
See application file for complete search history.

(56) References Cited

U.S. PATENT DOCUMENTS

| | | | |
|---|---|---|---|
| 7,741,593 B2 * | 6/2010 | Iwata et al. | .................... 348/308 |
| 8,067,720 B2 * | 11/2011 | Matsuda | ..................... 250/208.1 |
| 8,068,155 B2 * | 11/2011 | Muroshima et al. | .......... 348/294 |
| 8,553,107 B2 * | 10/2013 | Ishida | ........................... 348/308 |
| 2004/0239786 A1 | 12/2004 | Masuyama et al. | |
| 2005/0040485 A1 | 2/2005 | Kawahito | |
| 2006/0061675 A1 | 3/2006 | Kim | |
| 2009/0079849 A1 | 3/2009 | Kondo | |

FOREIGN PATENT DOCUMENTS

| | | |
|---|---|---|
| JP | A-2000-295530 | 10/2000 |
| JP | A 2004-312700 | 11/2004 |

(Continued)

OTHER PUBLICATIONS

International Search Report issued in PCT/JP2009/004136, dated Nov. 2, 2009. (with English-language translation).

(Continued)

*Primary Examiner* — Jason Whipkey
(74) *Attorney, Agent, or Firm* — Oliff PLC

(57) ABSTRACT

An imaging sensor has a pixel array in which pixels are disposed in a two-dimensional matrix state, a sampling part, a shutter control part, and a clipping circuit. A vertical signal line is coupled to the plurality of pixels disposed in a column direction, and to which a pixel signal is input from the pixels. The sampling part is coupled to the vertical signal line, and to which the pixel signal output to the vertical signal line is input. The clipping circuit is provided at an input side of the sampling part, and clips an electric potential of the vertical signal line to a first clip level before the pixel signal is input from the pixels to the vertical signal line when the shutter control part performs the global shutter operation. As a result, it is possible to stably operate the sampling part.

11 Claims, 9 Drawing Sheets

(56) References Cited

FOREIGN PATENT DOCUMENTS

| | | |
|---|---|---|
| JP | A 2005-065074 | 3/2005 |
| JP | A-2006-081189 | 3/2006 |
| JP | A 2007-043324 | 2/2007 |
| JP | A 2007-074435 | 3/2007 |
| JP | A 2009-077345 | 4/2009 |

OTHER PUBLICATIONS

International Preliminary Report on Patentability issued in PCT/JP2009/004136, mailed Apr. 12, 2011. (with English-language translation).

Jan. 14, 2014 Office Action issued in Japanese Patent Application No. 2010-526547 (with translation).

\* cited by examiner

IMAGING ELEMENT AND IMAGING DEVICE

CROSS-REFERENCE TO RELATED APPLICATION

This is a U.S. National Stage application claiming the benefit of prior filed International Application Number PCT/JP2009/004136, filed Aug. 26, 2009, in which the International Application claims a priority date of Sep. 1, 2008 based on prior filed Japanese Application Number 2008-223371, the entire contents of which are incorporated herein by reference.

TECHNICAL FIELD

The present application relates to an imaging sensor and an imaging device.

BACKGROUND ART

In resent years, video cameras and electronic cameras using a CMOS type imaging device become widely used in general. Plural pixels are disposed in a two-dimensional array state, and vertical signal lines to read output signals from respective pixels, sampling parts, a vertical scanning circuit, and a horizontal output circuit are included in the CMOS type imaging device.

Each pixel has a photoelectric conversion part converting received light into an electric charge being an electrical signal, an FD (floating diffusion) part storing the electric charge accumulated at the photoelectric conversion part, and a pixel amplifier generating an output signal based on the electric charge stored at the FD part. When a pixel is selected by a switch specifying an address of each pixel, the output signal is read to the vertical signal line by a constant current source.

Note that when the pixel is selected by the switch specifying the address of each pixel, a source follower circuit is made up by the pixel amplifier and the constant current source coupled to the vertical signal line.

For example, the CMOS type imaging device simultaneously reads the output signals from respective pixels for one row to respective vertical signal lines, and outputs the output signals read to the respective vertical signal lines from the imaging sensor by using the horizontal output circuit.

In general, it is often the case that a rolling electronic shutter in which the electric charges accumulated at the photoelectric conversion parts are sequentially transferred to the FD parts by each selected row is used in the CMOS type imaging device.

Note that a configuration enabling a global electronic shutter in which a gap in an exposure timing between pixels belonging to individual rows is eliminated by simultaneously transferring the electric charges accumulated at the photoelectric conversion parts of all pixels to the FD parts is proposed in the CMOS type imaging device (for example, Patent Document 1).

Patent Document 1: Japanese Unexamined Patent Application Publication No. 2007-74435

DISCLOSURE

Problems to be Solved

Incidentally, there is a case when, for example, data used for an automatic exposure control and an automatic focus control are acquired from plural areas by using the global electronic shutter while applying a rolling electronic shutter to acquire still images. In an imaging device as stated above, the global electronic shutter is enabled by using a sampling part, a horizontal output circuit and so on complying with the rolling electronic shutter.

Here, for example, the sampling part is made up by including a column amplifier (differential amplifier). For example, when the rolling electronic shutter is applied, a noise signal is read from the pixel to the vertical signal line and input to the column amplifier after the electric charge of the FD part of each pixel belonging to a read object row is reset. The column amplifier receives the input of the noise signal, performs a reset operation, and sets an electric potential of the vertical signal line from which the noise signal is read to a reference potential of the column amplifier. After that, the electric charge stored at the photoelectric conversion part is read as a signal.

However, when the global electronic shutter is applied, the imaging device once resets the electric charges of the FD parts as for all pixels simultaneously, and thereafter, exposes all pixels for the same period, and accumulates the electric charges at the photoelectric conversion parts. The imaging device simultaneously transfers the electric charges accumulated at the photoelectric conversion parts to the FD parts as for all pixels, and thereafter, performs the above-stated reset operation of the column amplifier prior to the reading of the signal held at the FD parts of the pixels belonging to each row. Accordingly, there is a case when an adequate electric potential cannot be set as the reference potential of the column amplifier, and in this case, an operation of the column amplifier becomes unstable.

Besides, when the rolling electronic shutter is applied for a moving image photographing, there is a possibility that an image quality deteriorates because a gap occurs in an exposure timing between pixels belonging to individual rows.

A proposition of the present application is to stably operate sampling parts even when a global electronic shutter is enabled by a control of a read operation from pixels. Besides, another proposition of the present application is to stably enable a signal sampling when the global electronic shutter is applied in a CMOS type imaging device having the sampling parts in which a rolling electronic shutter is to be applied.

Means for Solving the Problems

An imaging sensor has a pixel array in which a plurality of pixels are disposed in a two-dimensional matrix state, a sampling part, a shutter control part, and a clipping circuit. The pixels each has a photoelectric conversion part generating and accumulating an electric charge by an incident light and a charge-voltage conversion part converting the electric charge transferred from the photoelectric conversion part into a voltage.

A vertical signal line is coupled to the plurality of pixels disposed in a column direction, and to which a pixel signal containing a signal component in accordance with the electric charge generated at the photoelectric conversion part and a noise component acquired when the charge-voltage conversion part is reset is input from the pixels. The sampling part is coupled to the vertical signal line, and to which the pixel signal output to the vertical signal line is input.

The shutter control part makes the pixel array perform a global shutter operation which simultaneously transfers the electric charge accumulated at the photoelectric conversion part of the pixels at a plurality of rows to each charge-voltage conversion part, and outputs the pixels signal from the pixels to the vertical signal line by each of the selected rows.

The clipping circuit is provided at an input side of the sampling part, and clips an electric potential of the vertical signal line to a first clip level before the pixel signal is input from the pixels to the vertical signal line when the shutter control part performs the global shutter operation.

Effect

According to the present application, it is possible to stably operate sampling parts even when a global electronic shutter is enabled by a control of a read operation from pixels.

DETAILED DESCRIPTION OF THE EMBODIMENTS

Hereinafter, embodiments of the present invention are described by using the drawings.

Figure 1:
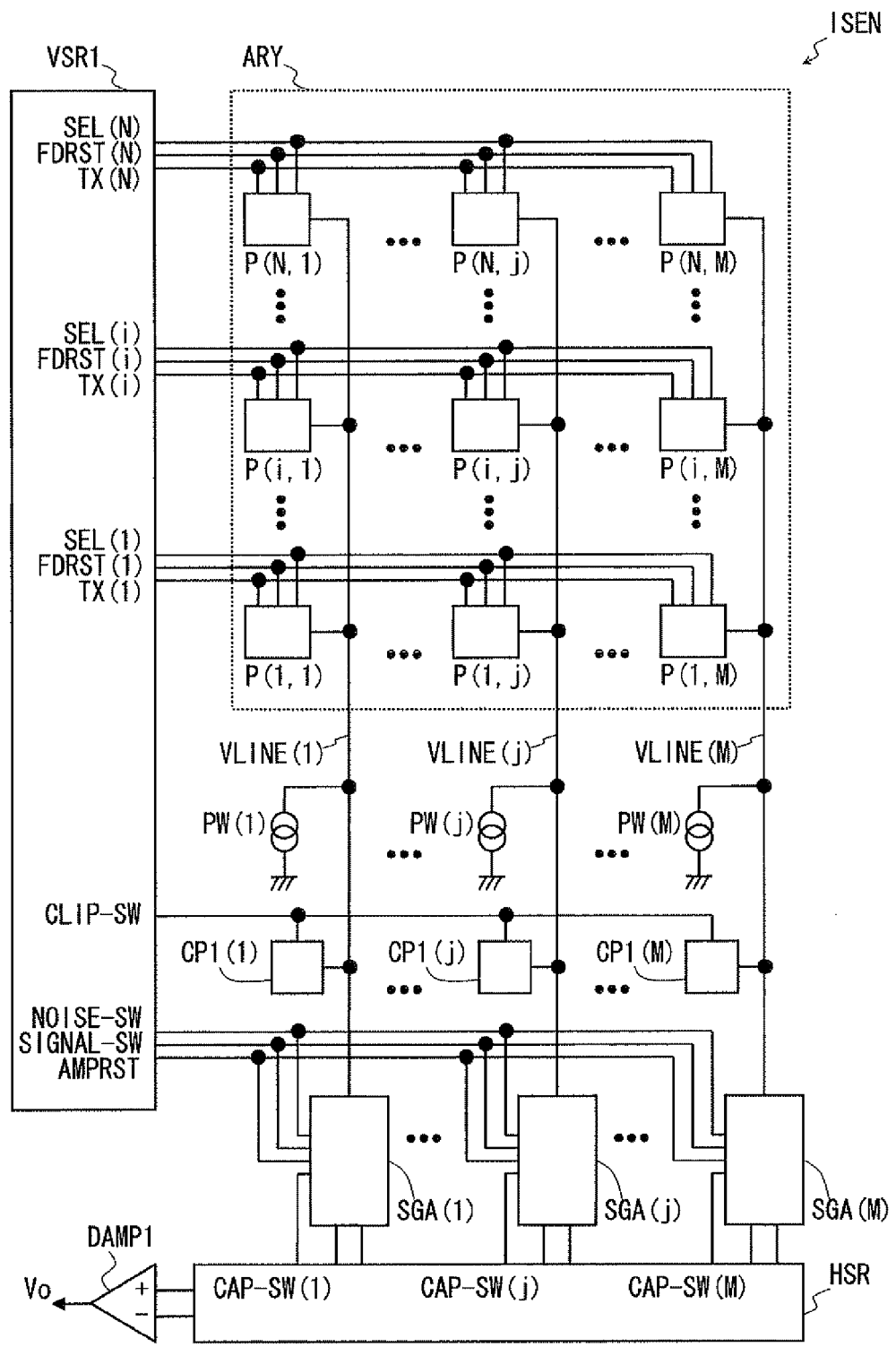
FIG. 1 is a view illustrating a schematic configuration of an imaging sensor in an embodiment.

FIG. 1 illustrates an embodiment of the present invention. An imaging sensor ISEN of this embodiment is mounted on, for example, an electronic camera.

The imaging sensor ISEN has N×M pieces of pixels P (i, j) (i=1 to N, j=1 to M), M pieces of vertical signal lines VLINE (j), M pieces of constant current sources PW (j), M pieces of clipping circuits CP1 (j), M pieces of column amplifiers SGA (j), a vertical scanning circuit VSR1, and a horizontal output circuit HSR.

For example, the N×M pieces of pixels P (i, j) are disposed in a two-dimensional matrix state, and make up a pixel array ARY. Note that the vertical signal lines VLINE (j), the constant current sources PW (j), the clipping circuits CP1 (j), and the column amplifiers SGA (j) are provided with correspond to columns of the pixels P (i, j).

Output signals of the respective pixels P (i, j) are read to the vertical signal lines VLINE (j) corresponding to the respective columns. Besides, the constant current sources PW (j) coupled to the vertical signal lines VLINE (j) at the respective columns supply read current to pixel amplifiers (not-illustrated) in source follower type of the respective pixels P (i, j).

The vertical scanning circuit VSR1 outputs various kinds of timing signals SEL (i), FDRST (i), TX (i) to read signals of the pixels P (i, j) at a selected row to the vertical signal line VLINE (j).

Further, in this embodiment, the vertical scanning circuit VSR1 outputs timing signals CLIP-SW, NOISE-SW, SIGNAL-SW, AMPRST. Note that the timing signals CLIP-SW, NOISE-SW, SIGNAL-SW, AMPRST may be supplied from outside of the imaging sensor ISEN (for example, a timing generator TG illustrated in later-described FIG. 8).

The signal read to each vertical signal line VLINE (j) is sampled by the corresponding column amplifier SGA (j).

The horizontal output circuit HSR sequentially outputs the signals held at the column amplifier SGA (j) to a differential amplifier DAMP1 by using a timing signal CAP-SW (j). The signals of the pixels P (i, j) at the selected row are thereby output by a row unit. The differential amplifier DAMP1 outputs a signal Vo corresponding to a difference between two input signals. Note that the imaging sensor ISEN may be made up without the differential amplifier DAMP1.

Figure 2:
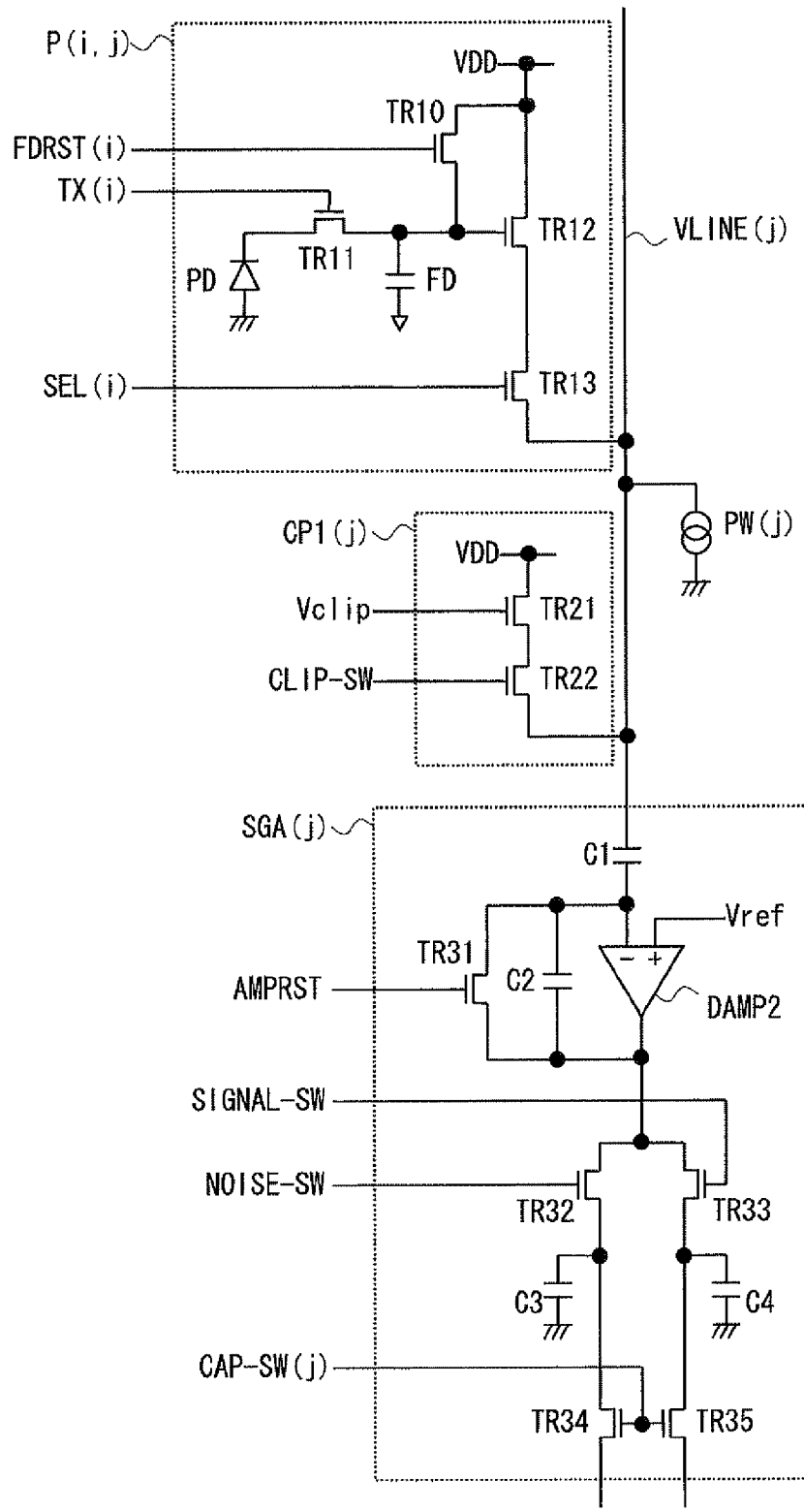
FIG. 2 is a view illustrating a detailed configuration example of the imaging sensor illustrated in FIG. 1.

FIG. 2 illustrates a detailed configuration example of the imaging sensor illustrated in FIG. 1. Each pixel P (i, j) has a photodiode PD, a reset transistor TR10, a transfer transistor TR11, an amplifying transistor TR12, a selection transistor TR13 and a floating diffusion part FD. Hereinafter, the floating diffusion part FD is also called as the FD part, and the photodiode PD is also called as the PD.

An electric charge acquired by a photoelectric conversion operation of the PD is transferred to be held at the FD part via the transfer transistor TR11 in each pixel P (i, j). The signal held at the FD part as stated above is output to the vertical signal line VLINE (j) via an amplification by the amplifying transistor TR12 when the selection transistor TR13 is turned on in accordance with the timing signal SEL (i).

For example, the FD part converts the electric charge transferred from the PD into a voltage by accumulating it in a capacitance, and inputs the converted voltage (the voltage at the capacitance of the FD part) to a gate of the amplifying transistor TR12. A source follower circuit is made up by the amplifying transistor TR12, the selection transistor TR13, and the constant current source PW (j) coupled to the vertical signal line VLINE (j) during a period when the selection transistor TR13 is in an on state. The signal of the pixel P selected by the timing signal SEL (i) is thereby transmitted to the vertical signal line VLINE (j).

Besides, a pixel reset resetting charge storages at the FD part and the PD is performed by setting both of the timing signals FDRST (i), TX (i) at the high-level and turning the reset transistor TR10 and the transfer transistor TR11 to an on state.

The clipping circuit CP1 (j) has transistors TR21, TR22 coupled in series between a power supply line VDD and the vertical signal line VLINE (j). The clipping circuit CP1 (j) has a function to clip an electric potential of the vertical signal line VLINE (j) to the electric potential dropped for a threshold voltage of the transistor TR21 ("Vt" illustrated in later-described FIG. 3) from a predetermined clipping voltage Vclip during a period when the transistor TR22 is in an on state. For example, the transistor TR22 is turned on when the timing signal CLIP-SW from the vertical scanning circuit VSR1 is in the high-level.

The column amplifier SGA (j) has a differential amplifier DAMP2, capacitors C1, C2, C3, C4, and transistors TR31, TR32, TR33, TR34, TR35. A minus terminal of the differential amplifier DAMP2 is coupled to the vertical signal line VLINE (j) via the capacitor C1, and a reference voltage Vref is given to a plus terminal. The electric potential of the vertical signal line VLINE (j) during a period when the transistor TR31 is in an on state is sample-held by the capacitor C1, and set as a reference potential in this differential amplifier DAMP2. For example, the transistor TR31 is turned on when the timing signal AMPRST from the vertical scanning circuit VSR1 is in the high-level.

Namely, an amplifier reset setting the reference potential as for an amplification operation of an amplifying part having the differential amplifier DAMP2 and the capacitors C1, C2 is performed by setting the timing signal AMPRST at the high-level and turning on the transistor TR31. Accordingly, the differential amplifier DAMP2 performs an inverting-amplification of a fluctuation relative to the electric potential of the vertical signal line VLINE (j) (reference potential) during the period when the transistor TR31 is in the on state. Note that the reference potential set by the amplifier reset is held at the capacitor C1 as stated above.

For example, the differential amplifier DAMP2 performs the inverting-amplification of a noise signal output to the vertical signal line VLINE (j) based on the reference potential set by the amplifier reset. The inverting-amplified noise signal is held at the capacitor C3 via the transistor TR32. For example, the transistor TR32 is turned on when the timing signal NOISE-SW corresponding to the noise signal is in the high-level.

Besides, the differential amplifier DAMP2 performs the inverting-amplification of a pixel signal output to the vertical signal line VLINE (j) based on the reference potential set by the amplifier reset. The inverting-amplified pixel signal is held at the capacitor C4 via the transistor TR33. For example, the transistor TR33 is turned on when the timing signal SIGNAL-SW corresponding to the pixel signal is in the high-level.

Here, the noise signal is a signal containing a nose component acquired when the FD part is reset, and the pixel signal is a signal containing a signal component in accordance with the electric charge generated at the PD and the noise component acquired when the FD part is reset.

These signals held at the capacitors C4, C3 are passed to the horizontal output circuit HSR via the transistors TR35, TR34 in accordance with an input of the timing signal CAP-SW (j) (a read signal CAP-SW (j)) from the horizontal output circuit HSR.

In the imaging sensor ISEN made up as stated above, a global electronic shutter is enabled by controlling, for example, various kinds of timing signals SEL (i), FDRST (i), TX (i) as described below. Note that a subscript representing a row or a column is not given such as the vertical signal line VLINE, the timing signal TX, when components or timing signals of respective rows or respective columns are not to be distinguished, in the following description.

Figure 3:
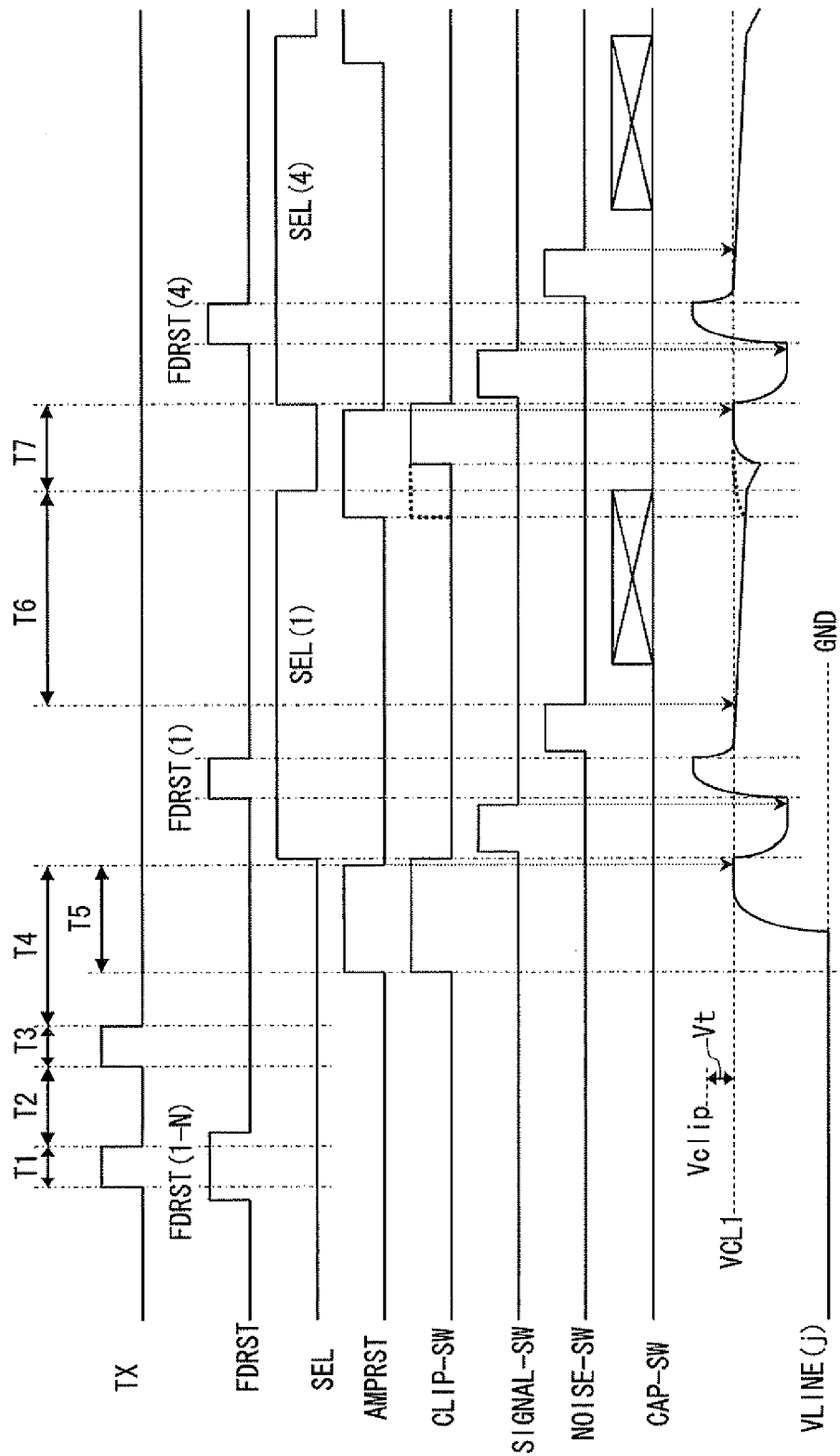
FIG. 3 is a view illustrating an example of an operation of the imaging sensor illustrated in FIG. 1.

FIG. 3 illustrates an example of an operation of the imaging sensor ISEN illustrated in FIG. 1.

At first, the timing signals SEL (i) specifying a read object row are kept at the low-level state as for all rows, and the timing signals FDRST (represented as "FDRST (1-N)" in FIG. 3), TX corresponding to all rows are set at the high-level (a period T1 in FIG. 3). Accordingly, the pixel reset is performed for all pixels P at the period T1.

Next, the timing signals TX corresponding to all rows are set at the high-level after a predetermined exposure time T2 has passed, and all pixels P transfer the electric charges acquired by the photodiodes PD to the corresponding FD parts at a period T3. Accordingly, photoelectric conversion results are simultaneously enabled to be held at all pixels P.

As stated above, the global electronic shutter is enabled by reading the pixel signals simultaneously held at all pixels P by each row via the vertical signal line VLINE (j).

The vertical scanning circuit VSR1 controls the pixel array ARY to output the noise signal to the vertical signal line VLINE after the pixel signal is output to the vertical signal line VLINE in the global electronic shutter operation.

Hereinafter, a method enabling a stable operation of the column amplifier SAG (j) corresponding to each vertical signal line VLINE (j) by controlling an operation of the clipping circuit CP1 (j) by the timing signal CLIP-SW is described. Note that the timing signal CLIP-SW is a signal to drive a clipping operation by the clipping circuit CP1, and it is generated by, for example, the vertical scanning circuit VSR1.

A case is described when a reading of a signal is performed after states of respective signal lines are stabled by providing a stabilization time T4 after the transfers from the PDs to the FD parts are simultaneously performed at all pixels P to enable the global electronic shutter as stated above.

The vertical scanning circuit VSR1 sets the timing signal CLIP-SW at the high-level in synchronization with the reference potential setting (a period T5 in FIG. 3) of the column amplifier SGA performed prior to the read operation of the signals at the respective rows. The timing signal CLIP-SW may be generated such that it changes to the high-level in synchronization with, for example, the timing signal AMPRST, and changes to a low-level state after the high-level state is maintained until a falling of the timing signal AMPRST.

The clipping circuit CP1 operates in accordance with the timing signal CLIP-SW as stated above. Accordingly, the electric potential of each vertical signal line VLINE (j) increases from a ground level (GND level) to a first clip level VCL1 at the reference potential setting period T5 of the column amplifier SGA. The increased electric potential is set as the reference potential of the differential amplifier DAMP2 in accordance with the falling of the timing signal AMPRST.

Namely, the clipping circuit CP1 clips the electric potential of each vertical signal line VLINE (j) to the first clip level VCL1 at the timing when the reference potential of a signal acquisition of the column amplifier SGA is determined.

In this case, for example, the clipping voltage Vclip supplied to the clipping circuit CP1 is set in advance at a voltage value in which the threshold voltage Vt of the transistor TR21 is added to the first clip level VCL1. Accordingly, it is possible to set the reference potential of the differential amplifier DAMP2 at the first clip level VCL1 in this embodiment.

Note that the clipping voltage Vclip may be generated inside the imaging sensor ISEN or supplied from outside of the imaging sensor ISEN.

After the reference potential is set as stated above, the timing signal SEL (1) corresponding to a row being the read object (for example, the first row) is set at the high-level, and the ED part of the pixel P at the selected row is coupled to the vertical signal line VLINE. The pixel signal corresponding to the electric charge transferred to the FD part of each pixel P at the period T3 is read to the vertical signal line VLINE in accordance with the above. A sampling of the pixel signal is performed by the column amplifier SGA in accordance with a change of the timing signal SIGNAL-SW.

After that, the electric charge accumulated at the ED part of the pixel P at the selected row is reset in accordance with the timing signal FDRST (1) corresponding to the row (for example, the first line) in which the reading of the pixel signal is completed as stated above. Accordingly, the noise signal indicating the noise component of each pixel P is read to the vertical signal line VLINE. Note that this noise signal is performed the sampling by the column amplifier SGA in accordance with a change of the timing signal NOISE-SW. The noise signal is sequentially passed to the horizontal output circuit HSR in accordance with the timing signal CAP-SW from the horizontal output circuit HSR together with a sampling result of the above-stated pixel signal.

As stated above, after the electric charge is transferred to the FD part of each pixel P by the control of the vertical scanning circuit VSR1, the clipping operation by the clipping circuit CP1 is driven at the timing when the reference potential is determined prior to the reading of the pixel signal corresponding to the electric charge to the column amplifier SGA via the vertical signal line VLINE. The electric potential of the vertical signal line VLINE is thereby set at a predetermined electric potential. Accordingly, the column amplifier SGA is able to perform the sampling of the pixel signal while using this predetermined electric potential as the reference.

Incidentally, the timing signal SEL corresponding to the read object row is maintained at the high-level at a period T6 including a horizontal scanning period (a rectangle in which a "x" sign is added in FIG. 3) when the sampling result passed to the horizontal output circuit HSR is output. Accordingly, a level change of the FD part caused by a dark current or the like is transmitted to the vertical signal line VLINE via the transistors TR12, TR13 because the selection transistor TR13 illustrated in the above-stated FIG. 2 is in the on state in the pixel P at the read object row.

Namely, the electric potential of the vertical signal line VLINE decreases gradually caused by the dark current and so on at the FD part of the pixel P belonging to the read object row coupled to the vertical signal line VLINE at the period T6.

Further, when a thinning-out reading of only a predetermined row is performed, a period T7 when the pixels P at all rows are detached from the vertical signal lines VLINE occurs. Accordingly, the electric potential of the vertical signal line VLINE drastically decreases at the period T7.

Note that in the operation in FIG. 3, the timing signal CLIP-SW is set at the high-level, and the clipping circuit CP1 is driven during the period T7 to recover the electric potential of the vertical signal line VLINE to the first clip level VCL1.

For example, the imaging sensor ISEN illustrated in the above-stated FIG. 1 sets the timing signal CLIP-SW at the high-level before the timing signal SEL (4) corresponding to the next read object row (for example, the fourth row) is in the high-level even when the thinning-out reading is performed. As a result, the clipping circuit CP1 is able to recover the electric potential of the vertical signal line VLINE before the pixel P belonging to the next read object row is coupled to the vertical signal line VLINE. Accordingly, it is possible to set the reference potential of the differential amplifier DAMP2 of the column amplifier SGA based on the electric potential of the vertical signal line VLINE in this embodiment.

As stated above, it is possible to increase the electric potential of the vertical signal line VLINE to a predetermined electric potential (for example, the first clip level VCL1) by operating the clipping circuit CP1 in this embodiment. Accordingly, it is possible to surely set the adequate reference potential to the column amplifier SGA in this embodiment. As a result, it is possible to dissolve a cause of a phenomenon in which the operation of the column amplifier SGA becomes unstable even when the global electronic shutter is applied in the imaging sensor ISEN in CMOS type including the column amplifier SGA. Namely, it is possible to stably operate the column amplifier SGA in this embodiment even when the global electronic shutter is applied.

Note that the imaging sensor ISEN may set the timing signal CLIP-SW at the high-level in synchronization with a rising of the timing signal AMPRST as illustrated in a heavy dotted line in FIG. 3 without waiting until the timing signal SEL (1) corresponding to the read object row (for example, the first row) becomes in the low-level. Namely, the imaging sensor ISEN may activate the operation of the clipping circuit CP1 without waiting until the timing signal SEL (1) corresponding to the read object row (for example, the first row) becomes in the low-level. In this case, the electric potential of the vertical signal line VLINE is increased to the first clip level VCL1 as illustrated in the heavy dotted line in FIG. 3.

Accordingly, the imaging sensor ISEN is able to acquire data used for, for example, an automatic exposure control and an automatic focus control from plural areas by using the global electronic shutter.

Figure 4:
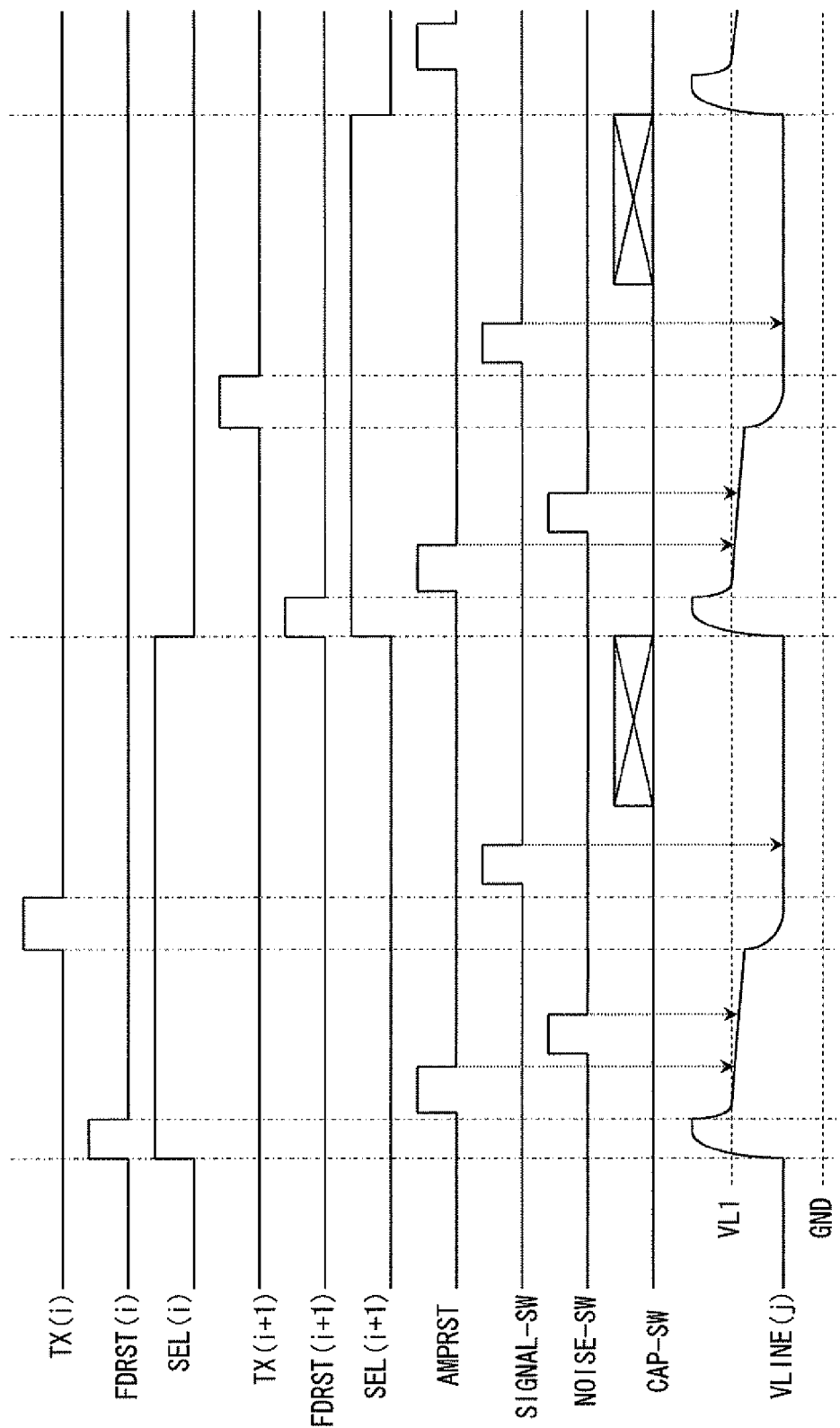
FIG. 4 is a view illustrating a comparative example of an operation of the imaging sensor.

FIG. 4 illustrates a comparative example of an operation of the imaging sensor ISEN. Note that an example of the operation of the imaging sensor ISEN when a rolling electronic shutter is enabled is illustrated in FIG. 4. Besides, in FIG. 4, the timing signals TX, FDRST, SEL are described while being separated into timing signals TX (i), FDRST (i), SEL (i) at the "i"-th row and the timing signals TX (i+1), FDRST (i+1), SEL (i+1) at the "i+1"-th row for easy to see the drawing.

At first, when the signal of the pixel P at the "i"-th row is read, the timing signal FDRST (i) is set at the high-level, and the pixel reset resetting the FD part is performed before the pixel signal and the noise signal are acquired into the column amplifier SGA.

Next, the timing signal AMPRST is set at the high-level, and the reference potential of the signal acquisition is set by using the electric potential of the vertical signal line VLINE (represented as "VL1" in FIG. 4) increased by the pixel reset operation.

The timing signal NOISE-SW is set at the high-level, and the column amplifier SGA acquires the noise signal. After that, the timing signals TX (i), SIGNAL-SW are sequentially set at the high-level, and the column amplifier SGA acquires the pixel signal corresponding to the electric charge transferred from the PD to the FD part.

Note that the operation to read the signal of the pixel P at the "i+1"-th row is the same as the operation to read the signal of the pixel P at the "i"-th row. The rolling electronic shutter is enabled by performing the exposure of the pixel P and the reading of the signal by each selected row. In the operation illustrated in FIG. 4, the reference potential of the signal acquisition is set by using the electric potential of the vertical signal line VLINE after the pixel reset at the selected row is performed, and therefore, it is possible to stably operate the column amplifier SGA even when the clipping circuit CP1 is not operated.

However, in a control to enable the global electronic shutter, the electric charge acquired at the PD by the exposure is already transferred to the FD part (represented by the periods T1, T2, T3 in the above-stated FIG. 3), and therefore, it is impossible to perform the pixel reset operation when the reference potential is set prior to the sampling operation. Accordingly, a problem described in later-described FIG. 5 occurs in an imaging sensor in which the clipping circuits CP1 are not provided when the global electronic shutter is tried to be enabled.

Figure 5:
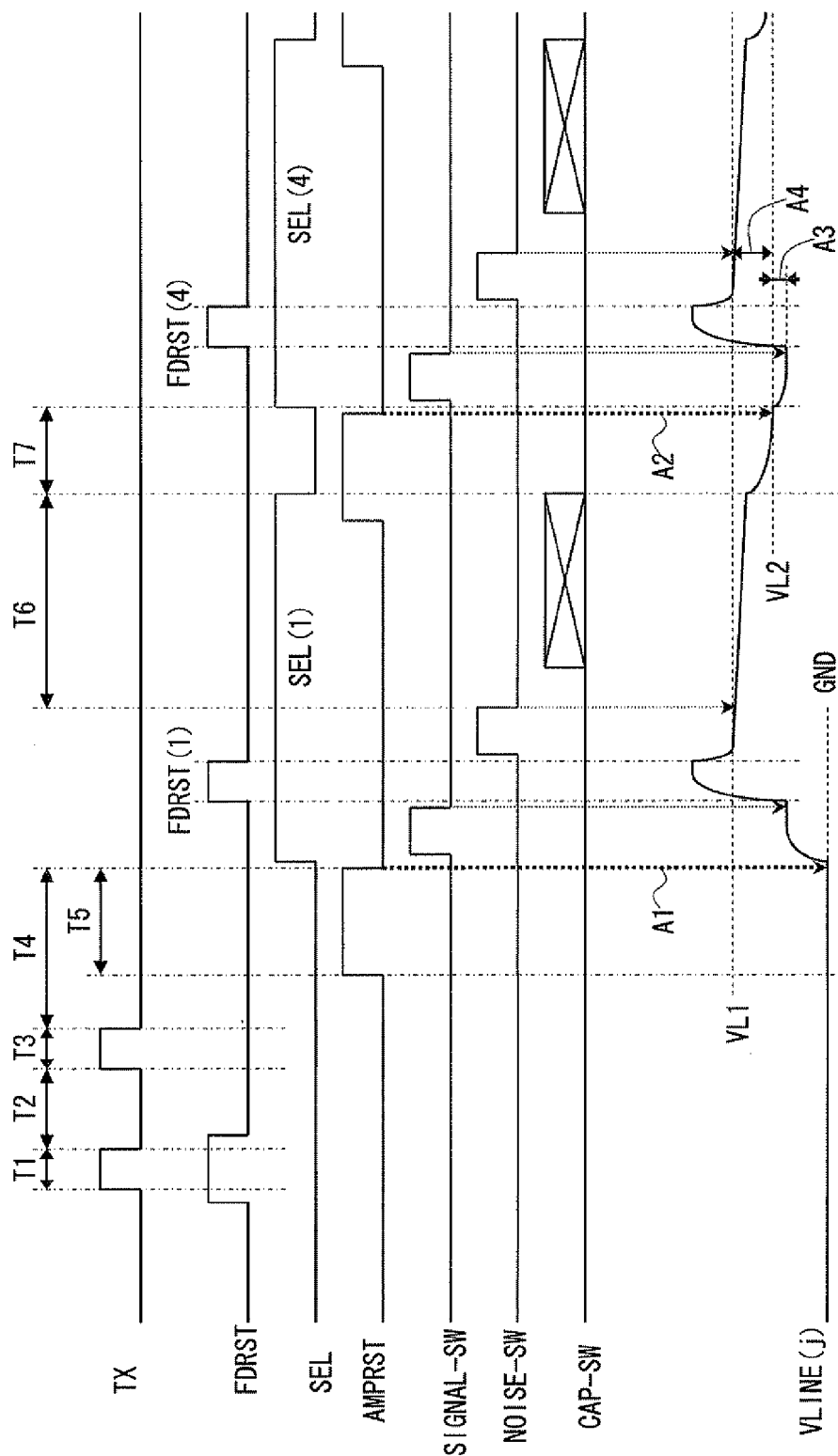
FIG. 5 is a view illustrating another comparative example of an operation of the imaging sensor.

FIG. 5 illustrates another comparative example of an operation of the imaging sensor ISEN. Note that FIG. 5 illustrates an example of the operation when the global electronic shutter is enabled in the imaging sensor in which the clipping circuit CP1 is not provided.

Operations of the timing signals TX, FDRST, SEL, AMPRST, SIGNAL-SW, NOIZE-SW, CAP-SW are the same as the above-stated FIG. 3.

As stated above, the electric charge acquired at the PD by the exposure is already transferred to the FD part (represented by the periods T1, T2, T3 in FIG. 5) in the operation of the global electronic shutter, and therefore, it is impossible to perform the pixel reset operation when the reference potential is set prior to the sampling operation. Accordingly, the set of the reference potential of the column amplifier SGA is performed under a state in which the electric potential of the vertical signal line VLINE decreases near a ground level (GND level) (illustrated by an arrow in a heavy dotted line with a symbol "A1" in FIG. 5).

As stated above, the operation of the column amplifier SGA becomes unstable when the reference potential of the column amplifier SGA is set under the state in which the electric potential of the vertical signal line VLINE decreases, and thereafter, the pixel signal is acquired from the FD part, and the noise signal is acquired after the pixel reset operation is performed.

It is because the pixel signal and the noise signal which are normally to be acquired while using the level VL1 corresponding to the pixel reset level as a reference are acquired as signals with reversed polarity using the ground level as the reference in the reading of the first row. Besides, the setting of the reference potential of the column amplifier SGA is performed when the electric potential of the vertical signal line VLINE decreases gradually caused by the dark current or the like after the electric potential of the vertical signal line VLINE is once increased by the pixel reset operation performed for the noise signal acquisition at the previous row in a row read after the next. Accordingly, an intermediate electric potential VL2 between the above-stated level VL1 and the ground level is set as the reference potential as indicated by an arrow in a heavy dotted line with a symbol "A2" in FIG. 5. At this time, a normal operation of the column amplifier SGA is prevented because the pixel signal is acquired as a decreased voltage part from the above-stated reference potential VL2, on the other hand, the noise signal is acquired as an increased voltage part from the above-stated reference potential VL2 (indicated by arrows in solid lines with symbols A3, A4 in FIG. 5). In particular, the electric potential of the vertical signal line VLINE decreases largely because the period when all of the pixels P are detached from the vertical signal lines VLINE (the period T7 in FIG. 5) occurs when a row thinning-out is performed.

On the other hand, it is possible to solve the problem of the column amplifier SGA when the global electronic shutter is enabled in the CMOS imaging sensor as stated above in this embodiment as described in the above-stated FIG. 1 to FIG. 3.

According to the clipping circuit CP1 and the vertical scanning circuit VSR1 included in the imaging sensor ISEN of this embodiment, the clipping circuit CP1 operates under a control by the vertical scanning circuit VSR1 at a timing when the reference potential is set at the column amplifier SGA. Accordingly, it is possible to set the electric potential of the vertical signal line VLINE to a predetermined electric potential, for example, to the above-stated first clip level VCL1 and to set this electric potential as the reference potential of the column amplifier SGA.

Accordingly, the imaging sensor ISEN of this embodiment is able to acquire the data used for, for example, the automatic exposure control and the automatic focus control from plural areas by using the global electronic shutter while applying the rolling electronic shutter for the acquisition of still images.

As stated above, the imaging sensor ISEN has the clipping circuit CP1 clipping the electric potential of the vertical signal line VLINE to the first clip level VCL1 before the pixel signal is input from the pixel P to the vertical signal line VLINE in this embodiment. Accordingly, it is possible to set the reference potential of the differential amplifier DAMP2 at the first clip level VCL1, and to stably enable the signal sampling when the global electronic shutter is applied in this embodiment.

Figure 6:
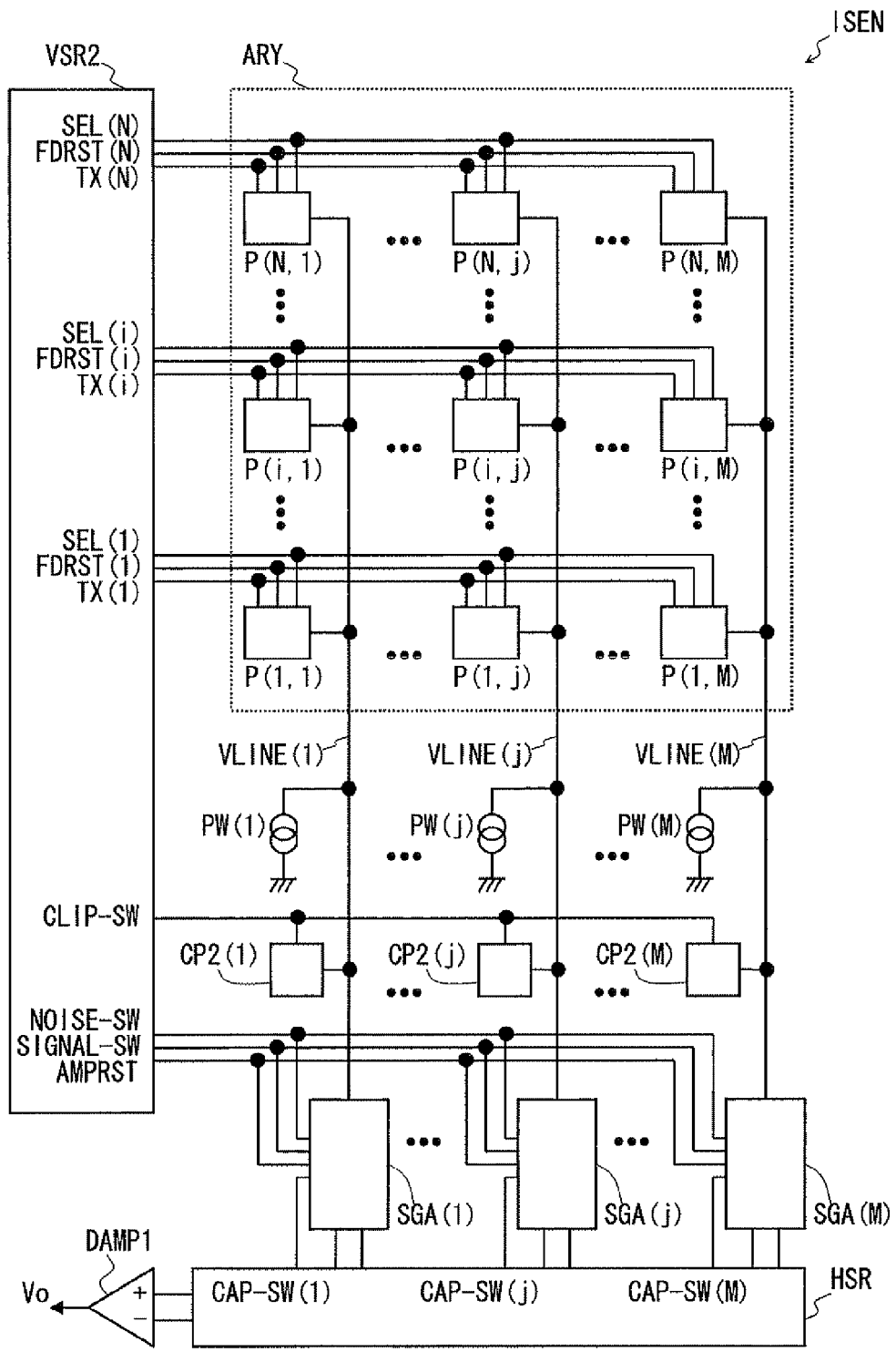
FIG. 6 is a view illustrating a schematic configuration of an imaging sensor in another embodiment.

FIG. 6 illustrates a schematic configuration of an imaging sensor ISEN according to another embodiment. The imaging sensor ISEN of this embodiment is mounted on, for example, an electronic camera. A vertical scanning circuit VSR2 and clipping circuits CP2 are respectively provided at the ISEN of this embodiment instead of the vertical scanning circuit VSR1 and the clipping circuits CP1 illustrated in the above-stated FIG. 1. The other configuration is the same as the imaging sensor ISEN illustrated in FIG. 1. The same reference symbols are used to designate the same and corresponding elements as the elements described in the above-stated embodiment, and the detailed description thereof will not be given.

The vertical scanning circuit VSR2 enables to switch between a rolling electronic shutter operation (for example, an operation illustrated in later-described FIG. 7) sequentially transferring the electric charges accumulated at the PDs of the pixels P to the FD parts by each selected row and the global electronic shutter operation (for example, the operation illustrated in the above-stated FIG. 3). Note that which operation between the rolling electronic shutter operation or the global electronic shutter operation is to be performed by the imaging sensor ISEN may be set by a user or set in advance with corresponding to a photographing mode or the like.

For example, the vertical scanning circuit VSR2 performs the global electronic shutter operation illustrated in the above-stated FIG. 3 at a time of a moving image photographing, and performs the rolling electronic shutter operation illustrated in the later-described FIG. 7 at a time of a still image photographing. Note that the data used for the automatic exposure control and the automatic focus control may be acquired by using the global electronic shutter or the rolling electronic shutter when the still image is photographed, in this embodiment.

The clipping circuit CP2 clips the electric potential of the vertical signal line VLINE at the first clip level VCL1 as illustrated in the above-stated FIG. 3 when the vertical scanning circuit VSR2 performs the global electronic shutter operation. Besides, the clipping circuit CP2 clips the noise signal input to the vertical signal line VLINE at a second clip level VCL2 as illustrated in the later-described FIG. 7 when the vertical scanning circuit VSR2 performs the rolling electronic shutter operation. Namely, different clipping voltages Vclip are supplied to the clipping circuit CP2 at the time of the global electronic shutter operation and the rolling electronic shutter operation. Note that a configuration of the clipping circuit CP2 is the same as, for example, the clipping circuit CP1 illustrated in the above-stated FIG. 2.

Figure 7:
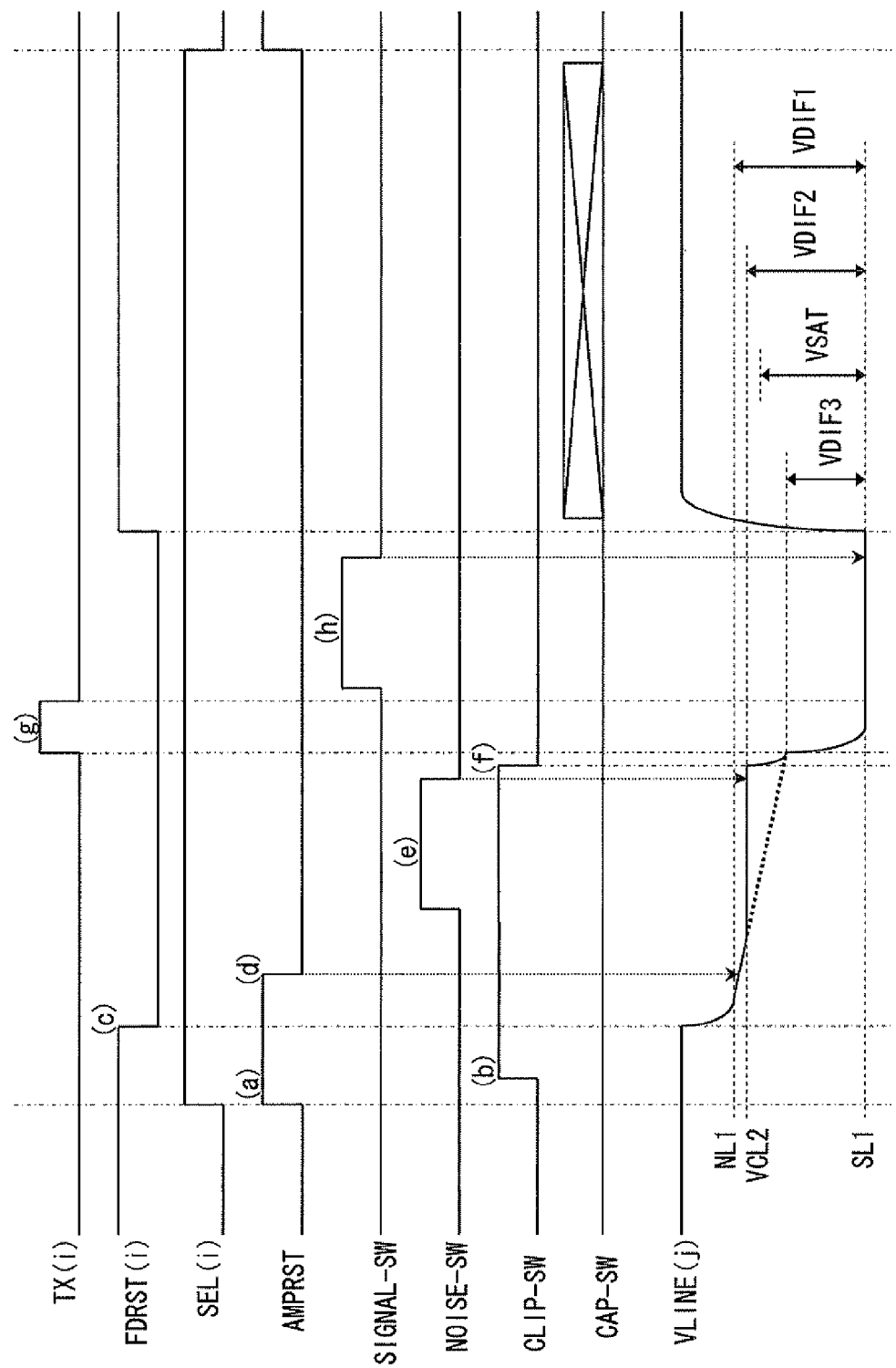
FIG. 7 is a view illustrating an example of a rolling electronic shutter operation of the imaging sensor illustrated in FIG. 6.

FIG. 7 illustrates an example of the rolling electronic shutter operation of the imaging sensor ISEN illustrated in FIG. 6. Note that FIG. 7 illustrates the operation of the imaging sensor ISEN when the noise signal and the pixel signal are respectively read out from each pixel P at the "i"-th row. Besides, a waveform of the vertical signal line VLINE represents an electric potential (voltage) of the vertical signal line VLINE at the "j"-th column.

For example, the vertical scanning circuit VSR2 illustrated in FIG. 6 controls the timing signals TX, FDRST, SEL as illustrated in FIG. 7, and controls the reset transistor TR10, the transfer transistor TR11, and the selection transistor TR13 illustrated in the above-stated FIG. 2. Further, the vertical scanning circuit VSR2 controls the timing signals CLIP-SW, AMPRST, NOISE-SW, SIGNAL-SW as illustrated in FIG. 7, and controls the transistors TR22, TR31, TR32, TR33 illustrated in FIG. 2. Note that the timing signals CLIP-SW, AMPRST, NOISE-SW, SIGNAL-SW may be supplied from outside of the imaging sensor ISEN (for example, a timing generator TG illustrated in later-described FIG. 8).

The timing signal FDRST (i) is maintained at the high-level and the reset transistor TR10 is turned on at a period when the timing signal SEL (i) is in the low-level (a period when the pixel P at the "i"-th row is not selected). Namely, the pixel P at the "i"-th row maintains a state in which the electric charge of the FD part is reset during the period when the pixel P at the "i"-th row is not selected.

At first, the timing signals SEL (i), AMPRST change from the low-level to the high-level (FIG. 7 (a)), and the transistors TR13, TR31 are turned on. The selection transistor TR13 is turned on, and thereby, a signal is output from the amplifying transistor TR12 to the vertical signal line VLINE. The transistor TR31 is turned on, and thereby, the minus terminal (input terminal) and an output terminal of the differential amplifier DAMP2 are set at approximately the same voltage as a reference voltage Vref. As a result, the amplifier reset described in FIG. 2 starts.

Next, the timing signal CLIP-SW changes from the low-level to the high-level (FIG. 7 (b)), and the transistor TR22 is turned on. The clipping circuit CP2 thereby operates, and clips the electric potential of the vertical signal line VLINE at the second clip level VCL2. Note that the signal output from the amplifying transistor TR12 (a voltage in accordance with the voltage of the FD part which is reset) is higher than the second clip level VCL2 at this time, and therefore, the vertical signal line VLINE maintains the electric potential of the signal output from the amplifying transistor TR12.

The timing signal FDRST (i) changes from the high-level to the low-level (FIG. 7 (c)), and the reset transistor TR10 is turned off. The noise signal containing the noise component acquired when the FD part is reset is thereby input to the vertical signal line VLINE. A noise level NL1 in the drawing represents a level of the noise signal input to the vertical signal line VLINE (j) at a normal operation time. Note that a case is illustrated in the example in FIG. 7 when the electric charge of the PD leaks to the FD part because a subject with high luminance is photographed. As a result, the electric potential of the vertical signal line VLINE (j) gradually decreases from the noise level NL1 as a lapse of time.

The timing signal AMPRST changes from the high-level to the low-level (FIG. 7 (d)) and the transistor TR31 is turned off after the noise signal is input to the vertical signal line VLINE. The amplifier reset described in FIG. 2 is thereby completed. Accordingly, the electric potential of the vertical signal line VLINE at this time is held by the capacitor C1 of the column amplifier SGA as the reference potential.

The timing signal NOISE-SW is maintained at the high-level for a certain period (FIG. 7 (e)), and the transistor TR32 is turned on for a certain period. The noise signal of the pixel P at the "i"-th row is thereby held by the capacitor C3 of the column amplifier SGA. Note that the electric potential of the vertical signal line VLINE (j) is maintained at the second clip level VCL2 by the clipping operation of the clipping circuit CP2 when the electric potential of the vertical signal line VLINE (j) decreases from the noise level NL1 to the second clip level VCL2.

The differential amplifier DAMP2 of the column amplifier SGA (j) performs the inverting amplification of the signal at the second clip level VCL2 based on the reference potential. Namely, the capacitor C3 of the column amplifier SGA (j) holds the signal in which the signal at the second clip level VCL2 is inverting amplified as the noise signal.

The timing signal CLIP-SW changes from the high-level to the low-level (FIG. 7 (f)) and the transistor TR22 is turned off after the timing signal NOISE-SW changes from the high-level to the low-level. The amplifying transistor TR12 is thereby able to output the pixel signal corresponding to the electric charge transferred to the FD part to the vertical signal line VLINE when the transfer transistor TR11 is turned on.

Besides, the timing signal TX (i) is maintained at the high-level for a certain period (FIG. 7 (g)) and the transfer transistor TR11 is turned on for a certain period after the timing signal NOISE-SW changes from the high-level to the low-level. The electric charge generated by the PD is thereby transferred to the FD part via the transfer transistor TR11. The voltage (pixel signal) in accordance with the electric charge of the FD part is output from the amplifying transistor TR12 to the vertical signal line VLINE via the selection transistor TR13.

The electric potential of the vertical signal line VLINE (j) thereby decreases from the second dip level VCL2 to a signal level SL1. As stated above, the vertical scanning circuit VSR2 controls the pixel array ARY so that the pixel signal is output to the vertical signal line VLINE after the noise signal is output to the vertical signal line VLINE in the rolling electronic shutter operation. Note that voltage differences VDIF (VDIF1, VDIF2, VDIF3) in the drawing represent voltage differences between the noise signals and the pixel signals.

The timing signal SIGNAL-SW is maintained at the high-level for a certain period (FIG. 7 (h)) and the transistor TR33 is turned on for a certain period after the timing signal TX (i) changes from the high-level to the low-level. The pixel signal of the pixel P at the "i"-th row is thereby held by the capacitor C4 of the column amplifier SGA. For example, the differential amplifier DAMP2 of the column amplifier SGA (j) performs the inverting amplification of the pixel signal at the signal level SL1 based on the reference potential. Namely, the pixel signal held by the capacitor C4 is the signal inversing amplified at the differential amplifier DAMP2.

The timing signals CAP-SW sequentially change to the high-level during a horizontal scanning period (a rectangle in which a "x" sign is added in FIG. 7). For example, the horizontal output circuit HSR changes the other timing signals CAP-SW to the low-level when the timing signal CAP-SW corresponding to the column of an output object is changed to the high-level. A pair of the transistors TR34, TR35 is thereby sequentially turned on by each column, and pairs of the noise signal and the pixel signal respectively held by the capacitors C3, C4 are sequentially output by each column.

Note that the timing signals TX, FDRST, SEL other than the timing signals TX (i), FDRST (i), SEL (i) are respectively maintained at the low-level, the high-level, and the low-level during a period when the pixel P at the "i"-th row is selected. The operation to read the signal of the pixel P at the next row ("i+1"-th row) is the same as the operation to read the signal of the pixel P at the "i"-th row. The rolling electronic shutter is enabled by performing the exposure of the pixel P and the reading of the signal by each selected row as stated above.

As stated above, it is possible to set the voltage difference VDIF2 between the noise signal and the pixel signal at a predetermined voltage VSAT or more because the noise signal input to the vertical signal line VLINE (j) is clipped at the second clip level VCL2 even when the electric charge of the PD leaks to the FD part in this embodiment. For example, a photographed image becomes white when the voltage difference VDIF is the voltage VSAT or more, and becomes a color in accordance with a size of the voltage difference VDIF when the voltage difference VDIF is the voltage VSAT or less. Accordingly, it is possible to prevent that a subject image becomes black even if the subject with high luminance is photographed in this embodiment.

For example, when the subject with high luminance is photographed, the electric charge generated at the PD leaks to the FD part because light intensity of incident light is large, and a level of the noise signal approximates to a level of the pixel signal. The voltage difference VDIF between the noise signal and the pixel signal thereby becomes small, and luminance represented by a pixel data (voltage difference VDIF) becomes relatively low. For example, when the sun is photographed, the luminance represented by a pixel data (voltage difference VDIF) of a sun image becomes extremely low, and the sun image becomes black. This phenomenon is called as, for example, a black sun.

Here, for example, in an imaging sensor in which the clipping circuits CP2 are not provided, the electric potential of the vertical signal line VLINE (j) becomes lower than the second clip level VCL2 as illustrated in a heavy dotted line in FIG. 7 when the electric charge of the PD leaks to the FD part. In this case, the black sun occurs because the voltage difference VDIF3 between the noise signal and the pixel signal becomes lower than the voltage VSAT. On the other hand, the clipping circuit CP2 clips the noise signal input to the vertical signal line VLINE (j) at the second clip level VCL2 as stated above, and therefore, the occurrence of the black sun can be prevented in this embodiment.

Note that when the subject is not with high luminance, the electric charge of the PD does not leak to the FD part, and therefore, the electric potential of the vertical signal line VLINE (j) maintains the noise level NL1 of the noise signal until the pixel signal is output to the vertical signal line VLINE (j). In this case, the voltage difference VDIF1 between the noise signal and the pixel signal is the voltage VSAT or more, and therefore, the black sun does not occur.

Accordingly, for example, the second clip level VCL2 is set such that it becomes the noise level NL1 or less and the voltage difference VDIF when the subject with high luminance is photographed becomes the voltage VSAT or more. Besides, the clipping voltage Vclip supplied to the clipping circuit CP2 is set at a voltage value in which the threshold voltage Vt of the transistor TR21 is added to the second clip level VCL2 when the vertical scanning circuit VSR2 performs the rolling electronic shutter operation.

Figure 8:
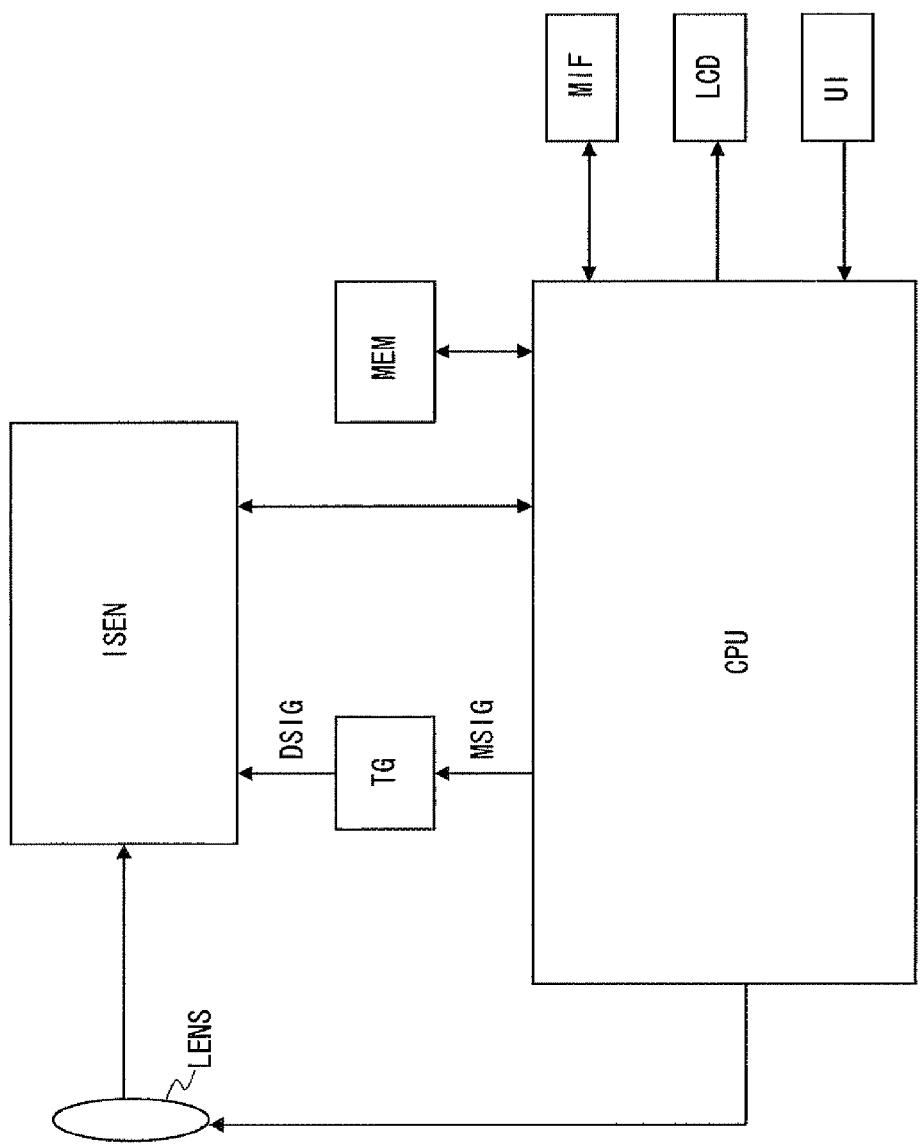
FIG. 8 is a view illustrating an example of an imaging device made up by using the imaging sensor illustrated in FIG. 6.

FIG. 8 illustrates an example of an imaging device made up by using the imaging sensor ISEN illustrated in FIG. 6. The imaging device in this embodiment is, for example, an electronic camera, and has a global shutter mode and a rolling shutter mode. For example, the imaging device has the imaging sensor ISEN, an imaging lens LENS, a central processing unit CPU, a timing generator TG, a memory MEM, a storage medium interface MIF, a liquid crystal display LCD and an operation part UI. The imaging sensor ISEN is the imaging sensor ISEN illustrated in the above-stated FIG. 6. Note that the imaging device may be made up by including the imaging sensor ISEN illustrated in FIG. 1 instead of the imaging sensor ISEN illustrated in FIG. 6.

The imaging lens LENS forms an image of a subject on a light-receiving surface of the imaging sensor ISEN. Note that the imaging device may have a zoom lens, a focus lens, and so on, in addition to the imaging lens LENS. The CPU controls operations of the imaging device based on not-illustrated programs. For example, the CPU performs the automatic exposure control, the automatic focus control, a control of the imaging sensor ISEN, a control of the timing generator TG, a record of image data, and so on.

Besides, for example, the CPU supplies a mode control signal MSIG indicating either of the global shutter mode or the rolling shutter mode to the timing generator TG. Note that the CPU may supply the mode control signal MSIG to the timing generator TG and the imaging sensor ISEN. In this case, the configuration and the control of the imaging sensor ISEN (the vertical scanning circuit VSR2, the clipping circuit CP2, and so on) which enables to switch between the rolling electronic shutter operation and the global electronic shutter operation can be made easy.

The timing generator TG is controlled by the CPU, and supplies a driving signal DSIG to the imaging sensor ISEN. For example, the timing generator TG supplies the driving signals DSIG of the vertical scanning circuit VSR2 and the horizontal output circuit HSR illustrated in the above-stated FIG. 6 to the imaging sensor ISEN.

For example, when the mode control signal MSIG indicates the global shutter mode, the timing generator TG supplies the driving signal DSIG to make the imaging sensor ISEN perform the operation illustrated in the above-stated FIG. 3 to the imaging sensor ISEN. Besides, for example, the mode control signal MSIG indicates the rolling shutter mode, the timing generator TG supplies the driving signal DSIG to make the imaging sensor ISEN perform the operation illustrated in the above-stated FIG. 7 to the imaging sensor ISEN. It is thereby possible for the imaging device to switch the operation of the imaging sensor ISEN between the rolling electronic shutter operation and the global electronic shutter operation.

Note that, for example, when the vertical scanning circuit VSR2 does not generate the timing signals CLIP-SW, NOISE-SW, SIGNAL-SW, AMPRST, the timing generator TG supplies the timing signals CLIP-SW, NOISE-SW, SIGNAL-SW, AMPRST to the imaging sensor ISEN. Besides, the timing generator TG may be provided inside the CPU, or inside the imaging sensor ISEN.

The memory MEM is for example, a built-in memory formed by a nonvolatile memory such as a flash memory, and stores programs and so on to control the operations of the imaging device. Note that the memory MEM may store image data and so on of photographed images. The storage medium interface MIF is an interface between a storage medium to store the image data and so on of the photographed images and the imaging device, and it is a slot or the like to which the storage medium is inserted.

The LCD displays the photographed image, the image stored in the storage medium, a menu screen and so on. The operation part UI has a release button and the other various kinds of switches, and it is operated by the user to operate the imaging device. For example, when the shutter mode is set by the user, the user sets the shutter mode to either of the global shutter mode or the rolling shutter mode by operating the operation part UI.

As stated above, the similar effect as the above-stated embodiment can also be obtained in this embodiment. Further, the imaging sensor ISEN of this embodiment has the clipping circuit CP2 clipping the noise signal input to the vertical signal line VLINE at the second clip level VCL2 when the vertical scanning circuit VSR2 performs the rolling electronic shutter operation. It is thereby possible in this embodiment to prevent that the subject image becomes black when the subject with high luminance is photographed. In particular, the occurrence of the black sun can be prevented in this embodiment.

Figure 9:
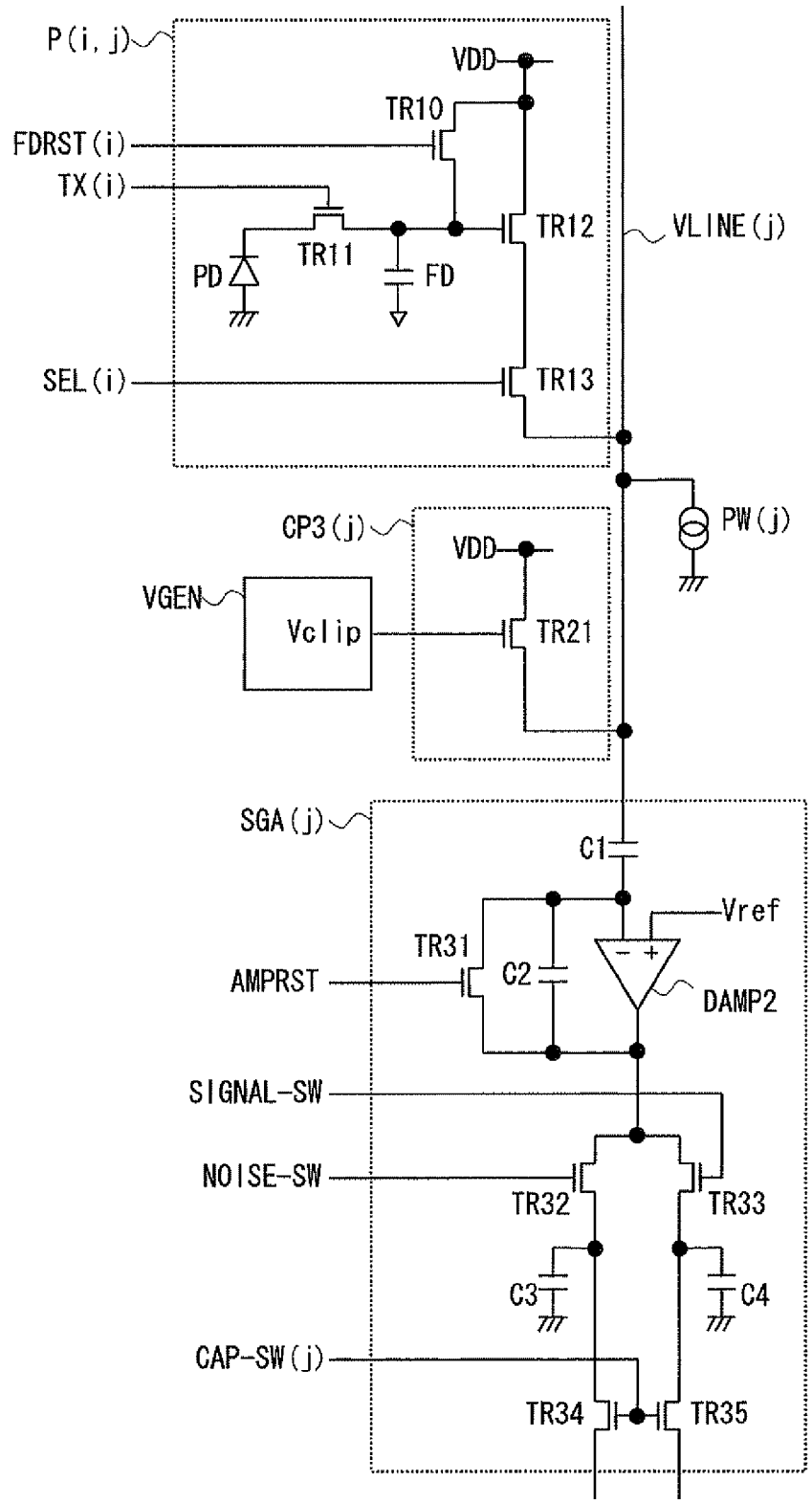
FIG. 9 is a view illustrating another configuration example of a clipping circuit illustrated in FIG. 1.

Note that an example in which the clipping circuit CP1 is made up by including the transistors TR21, TR22 is described in the above-stated embodiment. The present invention is not limited to such embodiment. For example, as illustrated in FIG. 9, a clipping circuit CP3 may be made up by excluding the transistor TR22 from the configuration illustrated in the above-stated FIG. 2. In this case, for example, a clipping voltage generating part VGEN illustrated in FIG. 9 gives the clipping voltage Vclip to the transistor TR21 during a period when the timing signal CLIP-SW illustrated in the above-stated FIG. 3 and FIG. 7 is at the high-level.

For example, the voltage generating part VGEN gives the clipping voltage Vclip to the transistor TR21 in synchronization with the timing signal AMPRST in the operation illustrated in FIG. 3. Note that the clipping voltage generating part VGEN may be provided inside the imaging sensor ISEN, or at outside of the imaging sensor ISEN (for example, inside the timing generator TG illustrated in the above-stated FIG. 8). The similar effect as the above-stated embodiment can be obtained also in this case.

An example in which the column amplifier SGA holds both the noise signal and the pixel signal is described in the above-stated embodiment. The present invention is not limited to such embodiment. For example, the imaging sensor ISEN may have a column amplifier holding only the pixel signal among the noise signal and the pixel signal instead of the column amplifier SGA illustrated in the above-stated FIG. 1 and FIG. 6. In this case, for example, the noise signal is output from the vertical signal line VLINE without intervention of the column amplifier. The similar effect as the above-stated embodiment can be obtained also in this case.

An example in which the imaging sensor ISEN performs the rolling electronic shutter operation illustrated in FIG. 7 is described in the embodiment described in the above-stated FIG. 6 to FIG. 8. The present invention is not limited to such embodiment. For example, the imaging sensor ISEN illustrated in FIG. 6 may perform the rolling electronic shutter operation illustrated in FIG. 4. In this case, the timing signal CLIP-SW is controlled to be maintained at the high-level until the noise signal is held at the capacitor C3 of the column amplifier SGA.

For example, the timing signal CLIP-SW changes from the low-level to the high-level before the timing signal AMPRST changes from the high-level to the low-level, and returns to the low-level after the timing signal NOISE-SW changes from the high-level to the low-level. The similar effect as the embodiment described in the above-stated FIG. 6 to FIG. 8 can be obtained also in this case. Besides, for example, the imaging sensor ISEN illustrated in FIG. 1 may perform the operation in which the control of the timing signal CLIP-SW is excluded from the rolling electronic shutter operation illustrated in FIG. 7. The similar effect as the embodiment described in the above-stated FIG. 1 to FIG. 5 can be obtained also in this case.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to exact construction and operation illustrated and described, and accordingly all suitable modifications and equivalents may be resorted to, falling within the scope thereof.

The invention claimed is:

1. An imaging sensor, comprising:
a pixel array in which a plurality of pixels are disposed in a two-dimensional matrix state, the pixels each having a photoelectric conversion part generating and accumulating an electric charge by an incident light and a charge-voltage conversion part converting the electric charge transferred from the photoelectric conversion part into a voltage;
a vertical signal line coupled to the plurality of pixels disposed in a column direction, and to which a pixel signal is input from the pixels, the pixel signal containing a signal component in accordance with the electric charge generated at the photoelectric conversion part and a noise component acquired when the charge-voltage conversion part is reset;
a sampling part coupled to the vertical signal line and to which the pixel signal output to the vertical signal line is input;
a shutter control part making the pixel array perform a global shutter operation which simultaneously transfers the electric charge accumulated at the photoelectric conversion part of the pixels at a plurality of rows to each charge-voltage conversion part, and outputting the pixel signal from the pixels to the vertical signal line by each of the rows being selected; and
a clipping circuit provided at an input side of the sampling part, and clipping an electric potential of the vertical signal line to a first clip level before the pixel signal is input from the pixels to the vertical signal line when the shutter control part performs the global shutter operation.

2. The imaging sensor according to claim 1, wherein
the shutter control part controls the pixel array to output a noise signal containing the noise component acquired when the charge-voltage conversion part is reset to the vertical signal line after the pixel signal is output to the vertical signal line in the global shutter operation.

3. The imaging sensor according to claim 2, wherein
the sampling part includes an amplifying part amplifying the pixel signal and the noise signal, and
the amplifying part has a reference potential hold part holding a reference potential for an amplification operation, and the reference potential is held when the clipping circuit clips the electric potential of the vertical signal line to the first clip level.

4. The imaging sensor according to claim 3, wherein
the shutter control part enables to switch between a rolling shutter operation and the global shutter operation, and controls the pixel array to output the pixel signal to the vertical signal line after the noise signal is output to the vertical signal line in the rolling shutter operation, the rolling shutter operation sequentially transfers the electric charge accumulated at the photoelectric conversion part of the pixels to the charge-voltage conversion part by each of the rows being selected.

5. The imaging sensor according to claim 4, wherein
the clipping circuit clips the noise signal input to the vertical signal line at a second clip level when the shutter control part performs the rolling shutter operation.

6. An imaging device having a global shutter mode and a rolling shutter mode, comprising:
the imaging sensor according to claim 4; and
a timing generating part receiving a mode control signal indicating either one of the global shutter mode and the rolling shutter mode, generating a timing signal controlling a driving of the imaging sensor in accordance with the mode control signal, and supplying the timing signal being generated to the imaging sensor, wherein
the shutter control part performs the global shutter operation in case of the global shutter mode and performs the rolling shutter operation in case of the rolling shutter mode.

7. The imaging device according to claim 6, wherein
the timing generating part generates a clipping control signal in accordance with the mode control signal and supplies the generated clipping control signal to the clipping circuit, and
the clipping circuit operates based on the clipping control signal, and clips the electric potential of the vertical signal line to the first clip level before the pixel signal is input from the pixels to the vertical signal line in case of the global shutter mode and clips the noise signal input to the vertical signal line at a second clip level in case of the rolling shutter mode.

8. The imaging sensor according to claim 2, wherein
the shutter control part enables to switch between a rolling shutter operation and the global shutter operation, and controls the pixel array to output the pixel signal to the vertical signal line after the noise signal is output to the vertical signal line in the rolling shutter operation, the rolling shutter operation sequentially transfers the electric charge accumulated at the photoelectric conversion part of the pixels to the charge-voltage conversion part by each of the rows being selected.

9. The imaging sensor according to claim 8, wherein
the clipping circuit clips the noise signal input to the vertical signal line at a second clip level when the shutter control part performs the rolling shutter operation.

10. An imaging device having a global shutter mode and a rolling shutter mode, comprising:
the imaging sensor according to claim 8; and
a timing generating part receiving a mode control signal indicating either one of the global shutter mode and the rolling shutter mode, generating a timing signal controlling a driving of the imaging sensor in accordance with the mode control signal, and supplying the timing signal being generated to the imaging sensor, wherein
the shutter control part performs the global shutter operation in case of the global shutter mode and performs the rolling shutter operation in case of the rolling shutter mode.

11. The imaging device according to claim 10, wherein
the timing generating part generates a clipping control signal in accordance with the mode control signal and supplies the generated clipping control signal to the clipping circuit, and
the clipping circuit operates based on the clipping control signal, and clips the electric potential of the vertical signal line to the first clip level before the pixel signal is input from the pixels to the vertical signal line in case of the global shutter mode and clips the noise signal input to the vertical signal line at a second clip level in case of the rolling shutter mode.

\* \* \* \* \*